United States Patent
Liao et al.

(10) Patent No.: US 8,754,448 B2
(45) Date of Patent: Jun. 17, 2014

(54) SEMICONDUCTOR DEVICE HAVING EPITAXIAL LAYER

(75) Inventors: Chin-I Liao, Tainan (TW); Teng-Chun Hsuan, Tainan (TW); Chin-Cheng Chien, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 115 days.

(21) Appl. No.: 13/286,222

(22) Filed: Nov. 1, 2011

(65) Prior Publication Data

US 2013/0105861 A1 May 2, 2013

(51) Int. Cl.
| | | |
|---|---|---|
| H01L 21/336 | (2006.01) | |
| H01L 29/66 | (2006.01) | |
| H01L 21/02 | (2006.01) | |
| H01L 29/165 | (2006.01) | |
| H01L 29/78 | (2006.01) | |

(52) U.S. Cl.
CPC ......... H01L 29/165 (2013.01); H01L 29/66636 (2013.01); H01L 29/7834 (2013.01); H01L 29/7848 (2013.01)
USPC ........... 257/192; 257/607; 257/616; 257/344; 438/300; 438/301; 438/302; 117/89; 117/21; 117/22; 117/43

(58) Field of Classification Search
CPC ............ H01L 29/7848; H01L 29/7834; H01L 29/7843; H01L 29/665; H01L 29/66636; H01L 29/66628; H01L 29/045; H01L 29/165; H01L 21/02532; H01L 21/02639; H01L 21/823807; H01L 21/823814
USPC .......... 117/89, 21, 22, 43; 257/190, 192, 336, 257/344, 408, E21.43, E21.431, E29.056, 257/E29.085, E29.267; 438/300, 301, 302
See application file for complete search history.

(56) References Cited

U.S. PATENT DOCUMENTS

| | | | |
|---|---|---|---|
| 4,891,303 | A | 1/1990 | Garza |
| 5,156,994 | A * | 10/1992 | Moslehi ........................ 438/647 |
| 5,217,910 | A | 6/1993 | Shimizu |
| 5,273,930 | A | 12/1993 | Steele |
| 5,356,830 | A | 10/1994 | Yoshikawa |
| 5,372,957 | A | 12/1994 | Liang |
| 5,385,630 | A | 1/1995 | Philipossian |
| 5,399,506 | A | 3/1995 | Tsukamoto |
| 5,625,217 | A | 4/1997 | Chau |
| 5,777,364 | A | 7/1998 | Crabbe |
| 5,783,478 | A | 7/1998 | Chau |
| 5,783,479 | A | 7/1998 | Lin |

(Continued)

OTHER PUBLICATIONS

Choudhury, P. and Schroder, K. Selective Silcon Epitaxy and Orientation Dependence of Growth. May 1973. Solid-state Science and Technology.*

Primary Examiner — Julio J Maldonado
Assistant Examiner — Cory Eskridge
(74) Attorney, Agent, or Firm — Winston Hsu; Scott Margo

(57) ABSTRACT

A semiconductor device includes a semiconductor substrate and a plurality of transistors. The semiconductor substrate includes at least an iso region (namely an open region) and at least a dense region. The transistors are disposed in the iso region and the dense region respectively. Each transistor includes at least a source/drain region. The source/drain region includes a first epitaxial layer having a bottom thickness and a side thickness, and the bottom thickness is substantially larger than or equal to the side thickness.

9 Claims, 6 Drawing Sheets

(56) References Cited

U.S. PATENT DOCUMENTS

| | | | |
|---|---|---|---|
| 5,960,322 A | 9/1999 | Xiang | |
| 6,030,874 A | 2/2000 | Grider | |
| 6,048,756 A | 4/2000 | Lee | |
| 6,074,954 A | 6/2000 | Lill | |
| 6,100,171 A | 8/2000 | Ishida | |
| 6,110,787 A | 8/2000 | Chan | |
| 6,165,826 A | 12/2000 | Chau | |
| 6,165,881 A | 12/2000 | Tao | |
| 6,191,052 B1 | 2/2001 | Wang | |
| 6,228,730 B1 | 5/2001 | Chen | |
| 6,274,447 B1 | 8/2001 | Takasou | |
| 6,274,894 B1 * | 8/2001 | Wieczorek et al. | 257/192 |
| 6,355,533 B2 | 3/2002 | Lee | |
| 6,365,476 B1 | 4/2002 | Talwar | |
| 6,368,926 B1 | 4/2002 | Wu | |
| 6,406,973 B1 | 6/2002 | Lee | |
| 6,444,591 B1 | 9/2002 | Schuegraf | |
| 6,537,370 B1 | 3/2003 | Hernandez | |
| 6,544,822 B2 | 4/2003 | Kim | |
| 6,605,498 B1 | 8/2003 | Murthy | |
| 6,613,695 B2 | 9/2003 | Pomarede | |
| 6,621,131 B2 | 9/2003 | Murthy | |
| 6,624,068 B2 | 9/2003 | Thakar | |
| 6,632,718 B1 | 10/2003 | Grider | |
| 6,642,122 B1 | 11/2003 | Yu | |
| 6,664,156 B1 | 12/2003 | Ang | |
| 6,676,764 B2 | 1/2004 | Joo | |
| 6,699,763 B2 | 3/2004 | Grider | |
| 6,703,271 B2 | 3/2004 | Yeo | |
| 6,777,275 B1 | 8/2004 | Kluth | |
| 6,806,151 B2 | 10/2004 | Wasshuber | |
| 6,809,402 B1 | 10/2004 | Hopper | |
| 6,858,506 B2 | 2/2005 | Chang | |
| 6,861,318 B2 | 3/2005 | Murthy | |
| 6,864,135 B2 | 3/2005 | Grudowski | |
| 6,869,867 B2 | 3/2005 | Miyashita | |
| 6,887,751 B2 | 5/2005 | Chidambarrao | |
| 6,887,762 B1 | 5/2005 | Murthy | |
| 6,891,192 B2 | 5/2005 | Chen | |
| 6,930,007 B2 | 8/2005 | Bu | |
| 6,946,350 B2 | 9/2005 | Lindert | |
| 6,962,856 B2 | 11/2005 | Park | |
| 6,972,461 B1 | 12/2005 | Chen | |
| 6,991,979 B2 | 1/2006 | Ajmera | |
| 6,991,991 B2 | 1/2006 | Cheng | |
| 7,037,773 B2 | 5/2006 | Wang | |
| 7,060,576 B2 | 6/2006 | Lindert | |
| 7,060,579 B2 | 6/2006 | Chidambaram | |
| 7,112,495 B2 | 9/2006 | Ko | |
| 7,118,952 B2 | 10/2006 | Chen | |
| 7,132,338 B2 | 11/2006 | Samoilov | |
| 7,169,675 B2 | 1/2007 | Tan | |
| 7,183,596 B2 | 2/2007 | Wu | |
| 7,202,124 B2 | 4/2007 | Fitzgerald | |
| 7,217,627 B2 | 5/2007 | Kim | |
| 7,288,822 B1 | 10/2007 | Ting | |
| 7,303,999 B1 | 12/2007 | Sriraman | |
| 7,335,959 B2 | 2/2008 | Curello | |
| 7,410,859 B1 | 8/2008 | Peidous | |
| 7,462,239 B2 | 12/2008 | Brabant | |
| 7,491,615 B2 | 2/2009 | Wu | |
| 7,494,856 B2 | 2/2009 | Zhang | |
| 7,494,858 B2 | 2/2009 | Bohr | |
| 7,592,231 B2 | 9/2009 | Cheng | |
| 7,667,227 B2 | 2/2010 | Shimamune | |
| 7,691,752 B2 | 4/2010 | Ranade | |
| 7,838,370 B2 | 11/2010 | Mehta | |
| 2002/0160587 A1 | 10/2002 | Jagannathan | |
| 2002/0182423 A1 | 12/2002 | Chu | |
| 2003/0181005 A1 | 9/2003 | Hachimine | |
| 2003/0203599 A1 | 10/2003 | Kanzawa | |
| 2004/0045499 A1 | 3/2004 | Langdo | |
| 2004/0067631 A1 | 4/2004 | Bu | |
| 2004/0227164 A1 | 11/2004 | Lee | |
| 2005/0070076 A1 | 3/2005 | Dion | |
| 2005/0079692 A1 | 4/2005 | Samoilov | |
| 2005/0082616 A1 | 4/2005 | Chen | |
| 2005/0139231 A1 | 6/2005 | Abadie | |
| 2005/0260830 A1 | 11/2005 | Kwon | |
| 2005/0285193 A1 | 12/2005 | Lee | |
| 2005/0287752 A1 | 12/2005 | Nouri | |
| 2006/0051922 A1 | 3/2006 | Huang | |
| 2006/0057859 A1 | 3/2006 | Chen | |
| 2006/0076627 A1 | 4/2006 | Chen | |
| 2006/0088968 A1 | 4/2006 | Shin | |
| 2006/0115949 A1 | 6/2006 | Zhang | |
| 2006/0163558 A1 | 7/2006 | Lee | |
| 2006/0228842 A1 | 10/2006 | Zhang | |
| 2006/0231826 A1 | 10/2006 | Kohyama | |
| 2006/0258126 A1 | 11/2006 | Shiono | |
| 2006/0281288 A1 | 12/2006 | Kawamura | |
| 2006/0292779 A1 | 12/2006 | Chen | |
| 2006/0292783 A1 | 12/2006 | Lee | |
| 2007/0023847 A1 | 2/2007 | Rhee | |
| 2007/0034906 A1 | 2/2007 | Wang | |
| 2007/0049014 A1 | 3/2007 | Chen | |
| 2007/0072353 A1 | 3/2007 | Wu | |
| 2007/0072376 A1 | 3/2007 | Chen | |
| 2007/0082451 A1 | 4/2007 | Samoilov | |
| 2007/0128783 A1 | 6/2007 | Ting | |
| 2007/0166929 A1 | 7/2007 | Matsumoto | |
| 2007/0200170 A1 * | 8/2007 | Yamasaki et al. | 257/330 |
| 2007/0262396 A1 | 11/2007 | Zhu | |
| 2008/0014688 A1 | 1/2008 | Thean | |
| 2008/0061366 A1 | 3/2008 | Liu | |
| 2008/0067545 A1 | 3/2008 | Rhee | |
| 2008/0076236 A1 | 3/2008 | Chiang | |
| 2008/0085577 A1 | 4/2008 | Shih | |
| 2008/0116525 A1 | 5/2008 | Liu | |
| 2008/0119031 A1 * | 5/2008 | Pal et al. | 438/483 |
| 2008/0124874 A1 | 5/2008 | Park | |
| 2008/0128746 A1 | 6/2008 | Wang | |
| 2008/0142886 A1 | 6/2008 | Liao | |
| 2008/0220579 A1 | 9/2008 | Pal | |
| 2008/0233722 A1 | 9/2008 | Liao | |
| 2008/0233746 A1 | 9/2008 | Huang | |
| 2009/0039389 A1 | 2/2009 | Tseng | |
| 2009/0045456 A1 | 2/2009 | Chen | |
| 2009/0095992 A1 | 4/2009 | Sanuki | |
| 2009/0117715 A1 | 5/2009 | Fukuda | |
| 2009/0124056 A1 | 5/2009 | Chen | |
| 2009/0166625 A1 * | 7/2009 | Ting et al. | 257/51 |
| 2009/0184402 A1 | 7/2009 | Chen | |
| 2009/0186475 A1 | 7/2009 | Ting | |
| 2009/0246922 A1 | 10/2009 | Wu | |
| 2009/0278170 A1 | 11/2009 | Yang | |
| 2009/0302348 A1 | 12/2009 | Adam | |
| 2010/0001317 A1 | 1/2010 | Chen | |
| 2010/0093147 A1 | 4/2010 | Liao | |
| 2013/0026538 A1 * | 1/2013 | Liao et al. | 257/190 |

* cited by examiner

SEMICONDUCTOR DEVICE HAVING EPITAXIAL LAYER

BACKGROUND OF THE INVENTION

1. Field of the Invention

The present invention relates to a semiconductor device and a method of fabricating the same, and more particularly, to a semiconductor device having an epitaxial layer and the method of forming the epitaxial layer.

2. Description of the Prior Art

With the trend of miniaturization of semiconductor device dimensions, the scale of the gate, source and drain of a transistor has dropped in accordance with the reduction of the critical dimension (CD). Due to the physical limitation of the materials used, the decrease of the gate, source and drain scale results in the diminution of the number of carriers that determine the magnitude of the current in the transistor element, which can adversely affect the performance of the transistor. Accordingly, in order to boost up a metal-oxide-semiconductor (MOS) transistor, increasing carrier mobility is an important consideration in the field of current semiconductor technique.

In the conventional technologies, a selective epitaxial growth (SEG) process is used to form a strained silicon layer. For example, after the formation of the gate, a silicon-germanium (SiGe) layer is formed in the predetermined location of the source/drain region, in which the lattice constant of silicon (Si) is 5.431 angstroms (A), and the lattice constant of germanium (Ge) is 5.646 A. The lattice constant of the SiGe layer is larger than the lattice constant of Si, which modifies the band structure of Si, and leads to the formation of a compressive strained silicon layer. The strained silicon layer induces stress in the channel region of PMOS transistor and enhances carrier mobility.

In order to meet the various requirements of consumers, electronic products are commonly constituted of various kinds of element regions, having different functions. In accordance with the demands of specifications and characteristics, each element region has a specific pattern density. To avoid a process deviation caused by the micro-loading effect, the semiconductor processes, such as the selective epitaxial growth process, may be respectively performed on the corresponding regions according to the pattern density. However, this approach affects the manufacturing costs and extends the manufacturing time. Therefore, establishing a semiconductor process simultaneously applicable to all of the element regions having individual pattern densities, without micro-loading effect, is an important issue in this field.

SUMMARY OF THE INVENTION

It is therefore one of the objectives of the present invention to provide a semiconductor device having epitaxial layers, and a method of forming epitaxial layer avoiding the process deviations caused by the micro-loading effect.

According to an exemplary embodiment of the present invention, the method of forming an epitaxial layer includes the following steps. First, a semiconductor substrate including at least a recess is provided. Then, a first selective epitaxial growth (SEG) process is performed to form a first epitaxial layer in the recess, in which the first selective epitaxial growth process has an operating pressure substantially smaller than or equal to 10 torr.

According to an exemplary embodiment of the present invention, the method of forming an epitaxial layer includes the following steps. First, a semiconductor substrate including at least a recess is provided. Then, a first selective epitaxial growth (SEG) process is performed to form a first epitaxial layer in the recess, in which gases including dichlorosilane (DCS), Germane ($GeH_4$) and hydrochloric acid (HCl) are introduced, and the ratio of the concentration for DCS:$GeH_4$:HCl may be (0.5-2.1):(1.5-3.3):1.

According to an exemplary embodiment of the present invention, a semiconductor device is provided. The semiconductor device includes a semiconductor substrate and a plurality of transistors. The semiconductor substrate includes at least an iso region (namely an open region) and at least a dense region. The transistors are respectively disposed in the iso region and the dense region, and each transistor includes at least a source/drain region. Furthermore, each of the source/drain regions includes a first epitaxial layer, the first epitaxial layer has a bottom thickness and a side thickness, with the bottom thickness larger than the side thickness, for each first epitaxial layer.

The present invention provides a selective epitaxial growth process having an operating pressure smaller than or equal to 10 torr for forming the first epitaxial layer. This step can be further performed on the semiconductor substrate in a plurality of regions having different pattern densities to form simultaneously the first epitaxial layers in the recesses, with each first epitaxial layer having the above mentioned specific structure characteristic, that is, its bottom thickness being larger than its side thickness. Accordingly, the process deviation due to the micro-loading effect may be eliminated, and the reliability of the semiconductor device can be improved.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred exemplary embodiments will be described in detail. The preferred exemplary embodiments of the present invention are illustrated in the accompanying drawings with numbered elements.

Figure 1:
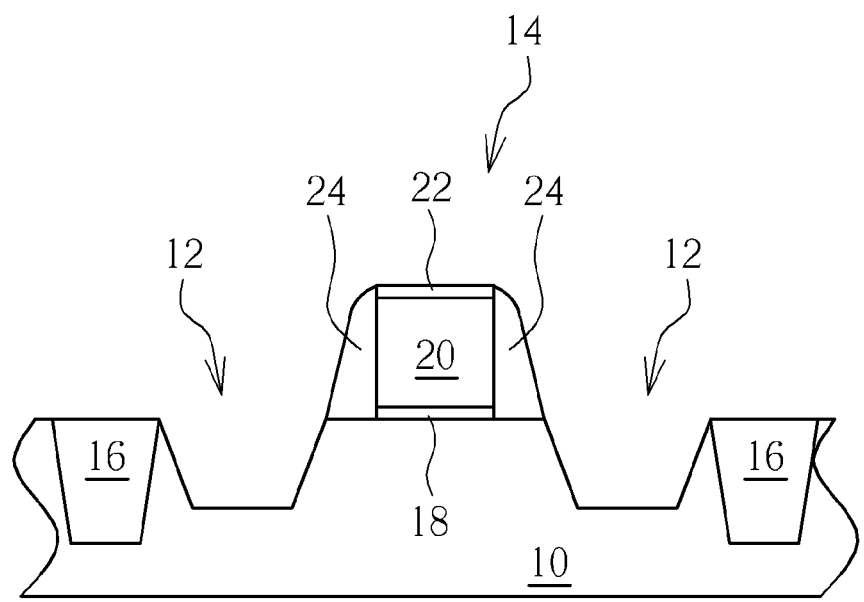
FIG. 1 through FIG. 6 illustrate a method of forming an epitaxial layer according to the first exemplary embodiment of the present invention.

Please refer to FIG. 1 through FIG. 6. FIG. 1 through FIG. 6 illustrate a method of forming an epitaxial layer according to the first exemplary embodiment of the present invention. As shown in FIG. 1, a semiconductor substrate 10 is provided, and the semiconductor substrate 10 includes at least a recess 12. A plurality of regions (not shown) could be defined on the semiconductor substrate 10, and each of the regions has its own pattern density. To simplify the explanation, the formation of a transistor in a region having any pattern density is used as an example. The semiconductor substrate 10 could be a substrate composed of AsGa, silicon on insulator (SOI) layer, epitaxial layer, SiGe layer or other semiconductor material. The semiconductor substrate 10 may further include at least a gate structure 14 and at least a shallow trench isolation (STI) 16, and the recess 12 is located in the active region between the gate structure 14 and the STI 16. The gate structure 14 includes a gate dielectric layer 18, a gate conductive layer 20 disposed on the gate dielectric layer 18, and a cap layer 22 disposed on the gate conductive layer 20. The gate dielectric layer 18 could be made of insulating materials such as silicon oxide, silicon oxynitride formed through thermal oxidation process or deposition process, or other high-k gate dielectric layers with a dielectric constant larger than 4. The gate conductive layer 20 may include conductive materials such as polysilicon, or metal layer with specific work function. The cap layer 22 can be made of insulating materials such as silicon nitride, silicon oxide, or silicon oxynitride. The STI 16 may include dielectric material such as silicon oxide. As the gate structure processes and the STI processes are known to those skilled in the art, the details are omitted herein for brevity.

The method of forming the recess 12 includes the following steps. At first, a first spacer 24 is selectively formed on the sides of each gate structure 14. Subsequently, an anisotropic dry etching process is performed to form the recesses 12 in the semiconductor substrate 10 at each of the two sides of the gate structure 14, in which the formed gate structure 14 and the formed first spacer 24 are used as masks. Additionally, it is also possible to combine a dry etching process with a wet etching process to form the recesses 12 in various shapes such as barrel shape, hexagon, or polygon, therefore, greater stress could be induced and provided to the later formed channel region by the epitaxial layers in the recesses 12. The first spacer 24 may include a monolayered structure or a multilayered structure made of silicon oxide or silicon nitride, moreover, the first spacer 24 could be a disposable spacer, that is, the first spacer 24 could be partially or totally removed after a later selective epitaxial growth process, but not limited thereto.

To form the epitaxial layer having high quality in the recess 12, before further epitaxial growth processes, a pre-clean step is first performed. For example, clean solution such as dilute hydrofluoric acid (DHF) solution, or a SPM solution including sulfuric acid ($H_2SO_4$), hydrogen peroxide ($H_2O_2$) and deionized water (DI water), is used to remove impurities such as native oxide layer upon the surface of the recess 12. Besides, a pre-bake step could also be implemented; for instance, the semiconductor substrate 10 is heated in a chamber with hydrogen introduced into to remove the native oxide layer upon the surface of the recess 12 or the residual clean solution.

Figure 2:
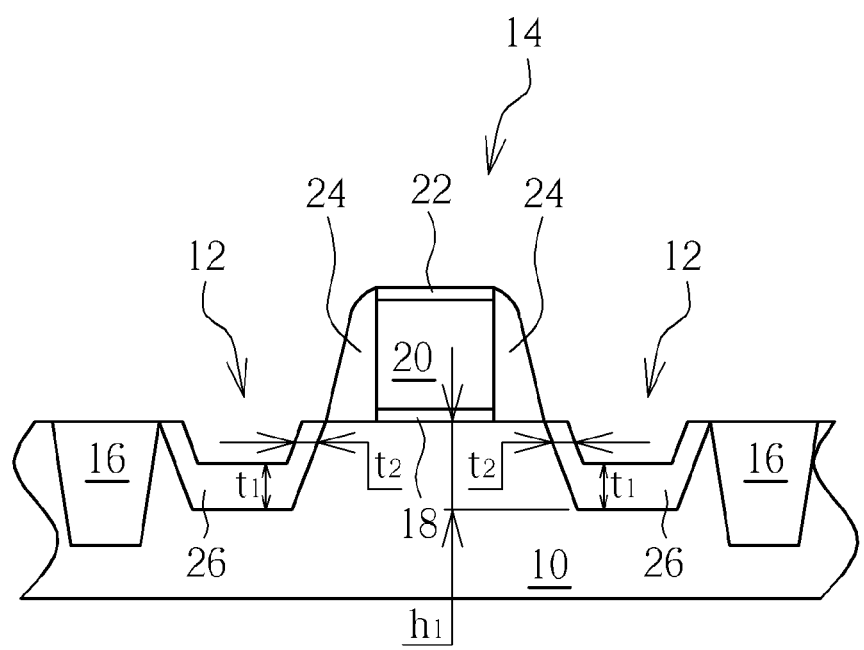

As shown in FIG. 2, a first selective epitaxial growth (SEG) process is performed to form a first epitaxial layer 26 in the recess 12. In this exemplary embodiment, the first selective epitaxial growth process has an operating pressure substantially smaller than or equal to 10 torr. For instance, gases comprising dichlorosilane (DCS), Germane ($GeH_4$) and hydrochloric acid (HCl) are introduced into the chamber with the operating pressure substantially smaller than or equal to 10 torr to form the first epitaxial layer 26 in the recess 12. The first epitaxial layer 26 includes a first material such as silicon-germanium (SiGe), with a lattice constant of the first material different from a lattice constant of the semiconductor substrate 10. DCS is the gas source of silicon, $GeH_4$ is the gas source of germanium, and a first germanium concentration of the first material may be determined by the concentration ratio of DCS and the concentration ratio of $GeH_4$. Preferably, the concentration ratio of DCS is substantially smaller than the concentration ratio of $GeH_4$. Additionally, HCl is used for the selective formation of the first epitaxial layer 26. Accordingly, the first epitaxial layer 26 could be formed on the silicon substrate of the surface of the recess 12, instead of being formed on the STI 16 or the first spacer 24, made of silicon oxide or silicon nitride. Preferably, a concentration ratio of HCl is substantially between the concentration ratio of DCS and the concentration ratio of $GeH_4$. In the introduced gases for forming the first epitaxial layer 26, the ratio of the concentration for DCS:$GeH_4$:HCl may be (0.5-2.1):(1.5-3.3):1 to form the first epitaxial layer 26 having the first germanium concentration between 20% and 30%. In this exemplary embodiment, the ratio of the concentration of DCS, the concentration of $GeH_4$ and the concentration of HCl may preferably be 0.97:2.2:1 to form the first epitaxial layer 26 having the first germanium concentration at 25%, but not limited thereto.

It is appreciated that the first epitaxial layer 26 has a bottom thickness t1 and a side thickness t2, and the bottom thickness t1 of the first epitaxial layer 26 is substantially smaller than a depth h1 of the recess 12. In other words, the recess 12 is not totally filled with the first epitaxial layer 26. Moreover, the bottom thickness t1 of the first epitaxial layer 26 is substantially larger than or equal to the side thickness t2 of the first epitaxial layer 26, and a ratio of the bottom thickness t1 to the side thickness t2 is substantially larger than or equal to 1, that is, the thickness of the first epitaxial layer 26 formed on the bottom surface of the recess 12 is substantially larger than or equal to the thickness of the first epitaxial layer 26 formed on the side surfaces of the recess 12. In this exemplary embodiment, the ratio of the bottom thickness t1 to the side thickness t2 is preferably and substantially larger than or equal to 1.4.

Figure 3:
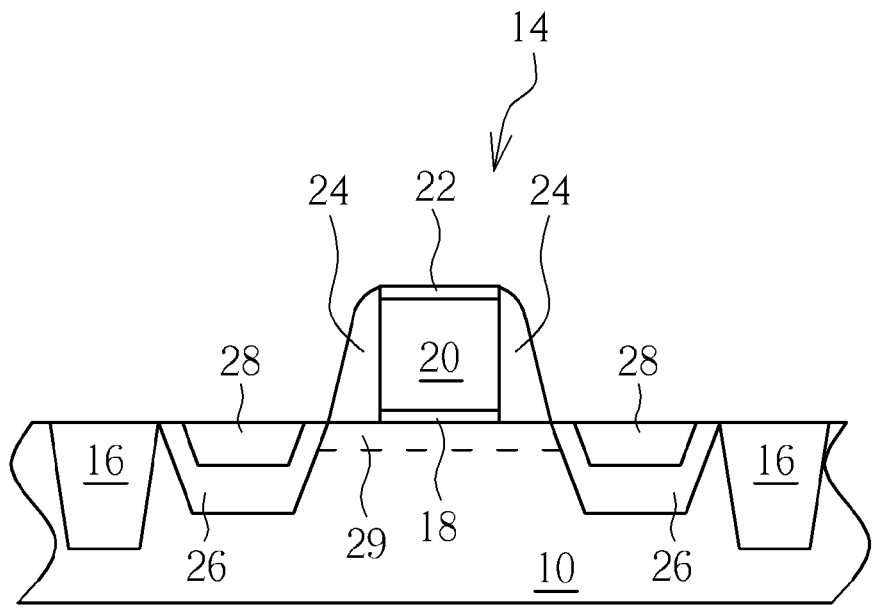

As shown in FIG. 3, a second selective epitaxial growth process is subsequently performed to form a second epitaxial layer 28 on the first epitaxial layer 26. In this exemplary embodiment, the second selective epitaxial growth process has an operating pressure substantially between 1 torr and 10 torr. For instance, gases including DCS, $GeH_4$ and HCl are introduced into the same chamber in which the first selective epitaxial growth process has been previously performed, to form the second epitaxial layer 28 on the first epitaxial layer 26. The second epitaxial layer 28 includes a second material such as silicon-germanium (SiGe), and a lattice constant of the second material which is also different from the lattice constant of the semiconductor substrate 10. Additionally, a second germanium concentration of the second material of the second epitaxial layer 28 is substantially larger than the first germanium concentration of the first material of the first epitaxial layer 26, for instance, the second epitaxial layer 28 has the second germanium concentration at 36%. The second epitaxial layer 28 is further used for inducing stress to the channel region 29 under the gate structure 14.

Figure 4:
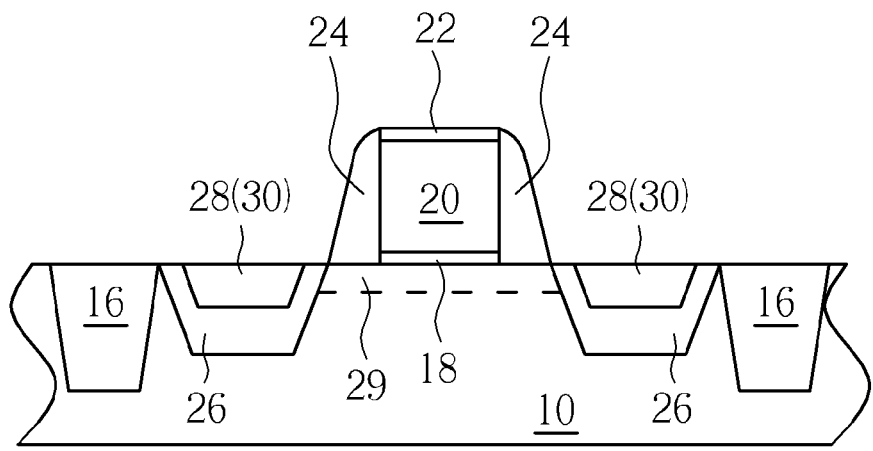

As shown in FIG. 4, the second selective epitaxial growth process could be an in-situ doped epitaxial growth process. Accordingly, during the formation of the second epitaxial layer 28, the conductive dopants may be simultaneously doped into the second epitaxial layer 28 to form a doped source/drain region 30. In this exemplary embodiment, the second selective epitaxial growth process may be in-situ doped epitaxial growth process. For instance, if the later formed transistor is PMOS transistor, during the formation of the second epitaxial layer 28, the conductive dopants such as boron ions may be simultaneously implanted into the second epitaxial layer 28 to serve as the corresponding doped source/drain region 30. Furthermore, an optional annealing process could be performed to activate the doped source/drain region 30.

It is appreciated that the first epitaxial layer 26 and the second epitaxial layer 28 are preferably made of the same material such as silicon-germanium (SiGe) but having different composition ratios. For instance, the second germanium concentration of the second epitaxial layer 28 is substantially larger than the first germanium concentration of the first epitaxial layer 26. Additionally, the second epitaxial layer 28 includes conductive dopants, such as boron ions, while the first epitaxial layer 26 does not include any. In order to avoid the abnormal leakage of the later formed transistor, the first epitaxial layer 26 is disposed between the second epitaxial layer 28 and the semiconductor substrate 10 to prevent the diffusion of the conductive dopants from the second epitaxial layer 28 to the semiconductor substrate 10 through the dislocations between the epitaxial layers and the semiconductor substrate 10. Moreover, the first selective epitaxial growth process of this exemplary embodiment has its operating pressure substantially smaller than or equal to 10 torr, compared to the first selective epitaxial growth process of another exemplary embodiment having its operating pressure substantially larger than or equal to 50 torr, a volume of the second epitaxial layer 28 on the first epitaxial layer 26 of this exemplary embodiment is substantially larger than a volume of the second epitaxial layer 28 on the first epitaxial layer 26 of another exemplary embodiment. That is, the second epitaxial layer 28 of this exemplary embodiment can induce greater stress to the channel region 29. Moreover, the second epitaxial layer 28 could be disposed above, at the same level, or below the surface of the semiconductor substrate 10.

Figure 5:
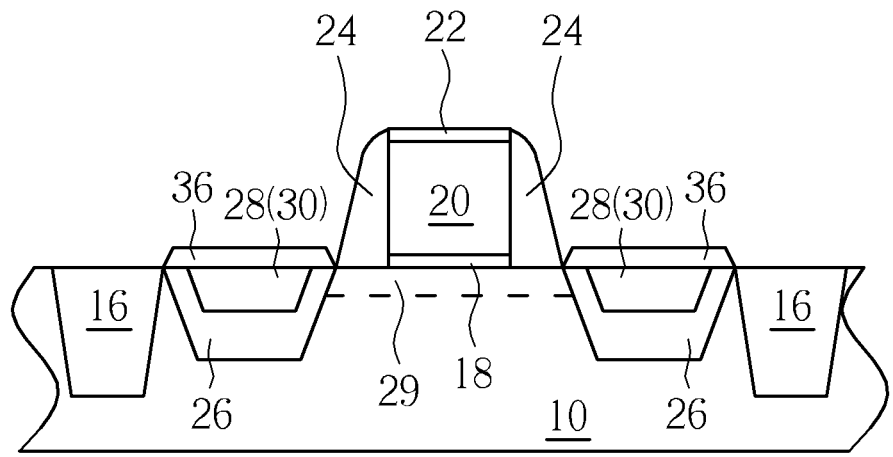

As shown in FIG. 5, a third selective epitaxial growth process is performed to form a third epitaxial layer 36 on the second epitaxial layer 28. In this exemplary embodiment, the third selective epitaxial growth process has an operating pressure substantially between 1 torr and 10 torr. For instance, the gas source of germanium, such as $GeH_4$, is closed, and the gas source of silicon such as DCS is introduced into the same chamber in which the first selective epitaxial growth process and the second selective epitaxial growth process have been previously performed to form the third epitaxial layer 36 on the second epitaxial layer 28.

Figure 6:
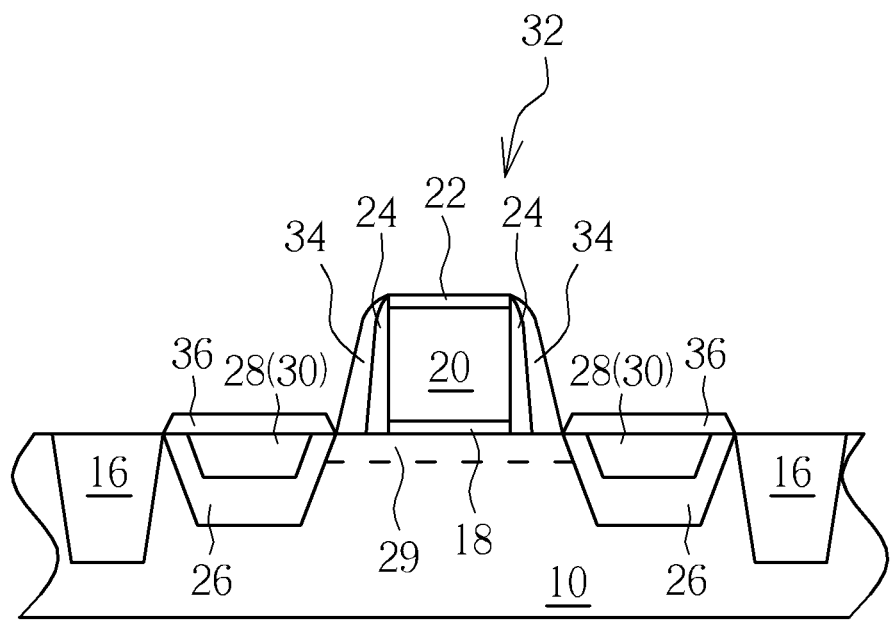

As shown in FIG. 6, after the end of the third selective epitaxial growth process, the first spacer 24 could be partially or totally removed, and a second spacer 34 is further formed. The second spacer 34 may be a monolayered structure or multilayered structure, may include a liner, or be a composition thereof. The material of the second spacer 34 could be high temperature oxide (HTO), silicon nitride, silicon oxide, or HCD-SiN formed by hexachlorodisilane ($Si_2Cl_6$), but not limited thereto. In this exemplary embodiment, the second spacer 34 does not overlap the third epitaxial layer 36, but it is not limited, the second spacer 34 may cross the third epitaxial layer 36, in other words, the second spacer 34 may partially overlap the third epitaxial layer 36. Subsequently, a self-aligned silicide process is performed to the third epitaxial layer 36. Accordingly, a transistor 32 is completed. A material of the third epitaxial layer 36 may include silicon (Si); consequently, the third epitaxial layer 36 can cover the defects on the surface of the second epitaxial layer 28 and ensure the proper formation of the salicide layer on the third epitaxial layer 36.

The order of the doped source/drain region process and the selective epitaxial growth processes could be adjusted according to the requirements of the transistor design. For instance, in an exemplary embodiment, the gate structure 14 and the second spacer 34 may serve as masks, and an ion implantation process and an annealing process are performed on the second epitaxial layer 28 and the third epitaxial layer 36 to form the doped source/drain region 30. In the other exemplary embodiment, an ion implantation process is performed on the semiconductor substrate 10 before the formation of the recess 12, and then the illustrated selective epitaxial growth processes are performed to build the doped source/drain region 30.

Figure 7:
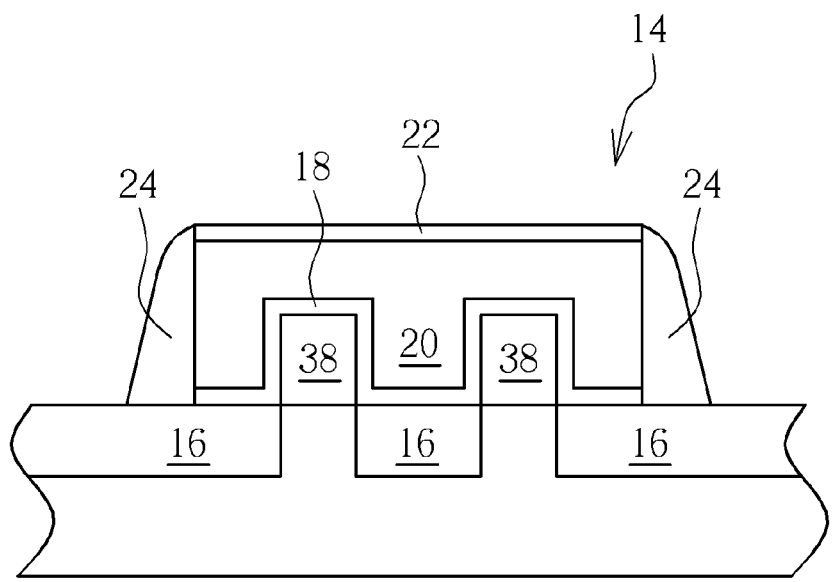
FIG. 7 through FIG. 9 illustrate a method of forming an epitaxial layer according to the second exemplary embodiment of the present invention.
Figure 8:
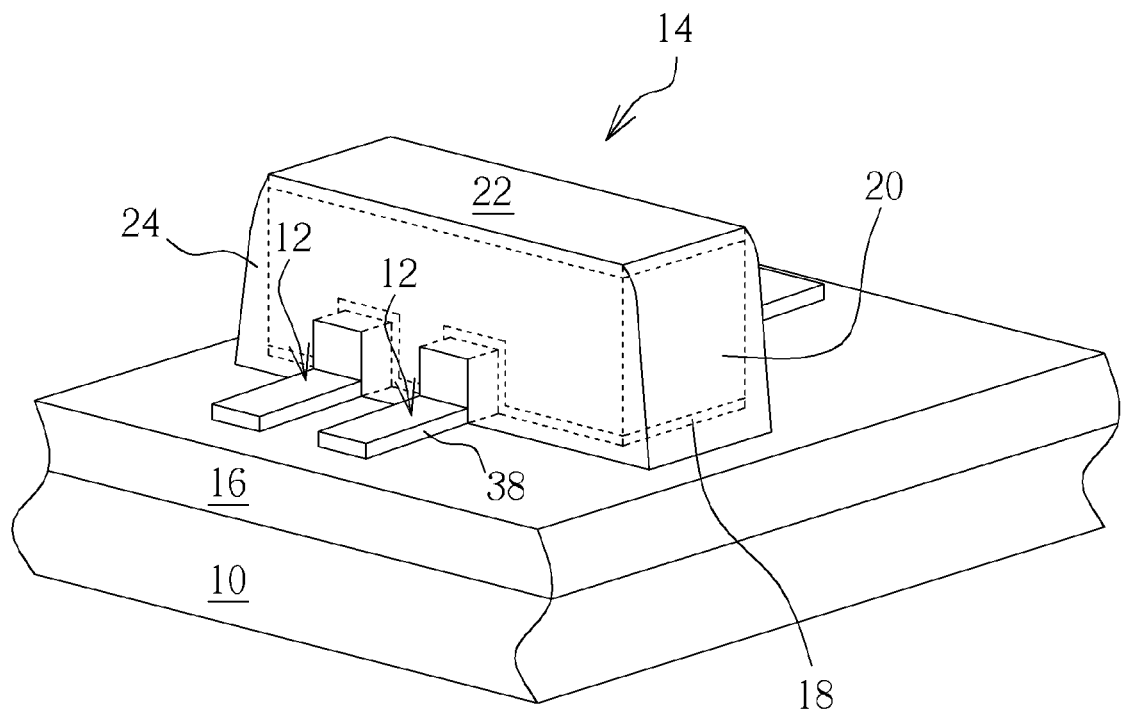
Figure 9:
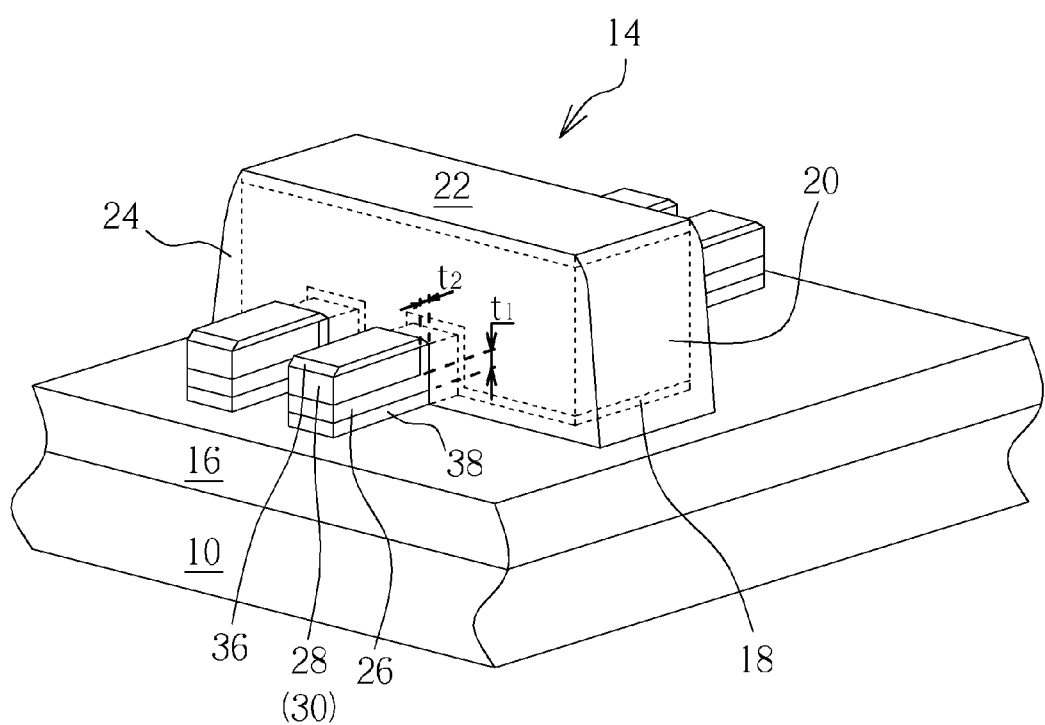

The present invention could be applicable for non-planar transistor as well. Please refer to FIG. 7 through FIG. 9. FIG. 7 through FIG. 9 illustrate a method of forming an epitaxial layer according to the second exemplary embodiment of the present invention. As shown in FIG. 7, the semiconductor substrate 10 including at least a fin structure 38 is provided. The semiconductor substrate 10 includes a plurality of fin structures 38 and shallow trench isolations (STI) 16. The fin structures 38 may include AsGa, silicon on insulator (SOI) layer, epitaxial layer, SiGe layer or other semiconductor material. STI 16 may be filled with insulating materials and disposed between the fin structures 38, or made of the bottom oxide layer of the silicon on insulator (SOI) substrate.

Subsequently, the gate structure 14 is formed to partially cover the fin structures 38, and the first spacer 24 is selectively formed on the sides of the gate structure 14, in which the elongation direction of the gate structure 14 crosses the elongation direction of the fin structures 38. As shown in FIG. 8, a dry etching process, such as an isotropic etching process, is performed to remove a portion of the fin structures 38, wherein the mask could be a patterned photoresist layer (not shown) or the gate structure 14 and the first spacer 24. Accordingly, recesses 12 are formed in the fin structures 38 at each of the two sides of the gate structure 14. Then, as shown in FIG. 9, the first selective epitaxial growth process, the second selective epitaxial growth process and the third selective epitaxial growth process illustrated previously are performed orderly; accordingly, the first epitaxial layer 26, the second epitaxial layer 28 and the third epitaxial layer 36 illustrated are formed in the recesses 12. Wherein the first selective epitaxial growth process has an operating pressure substantially smaller than or equal to 10 torr, as to the first epitaxial layer 26, the bottom thickness t1 is substantially larger than or equal to the side thickness t2. Additionally, an ion implantation process could be further performed to make the second epitaxial layer 28 include the doped source/drain region 30.

Figure 10:
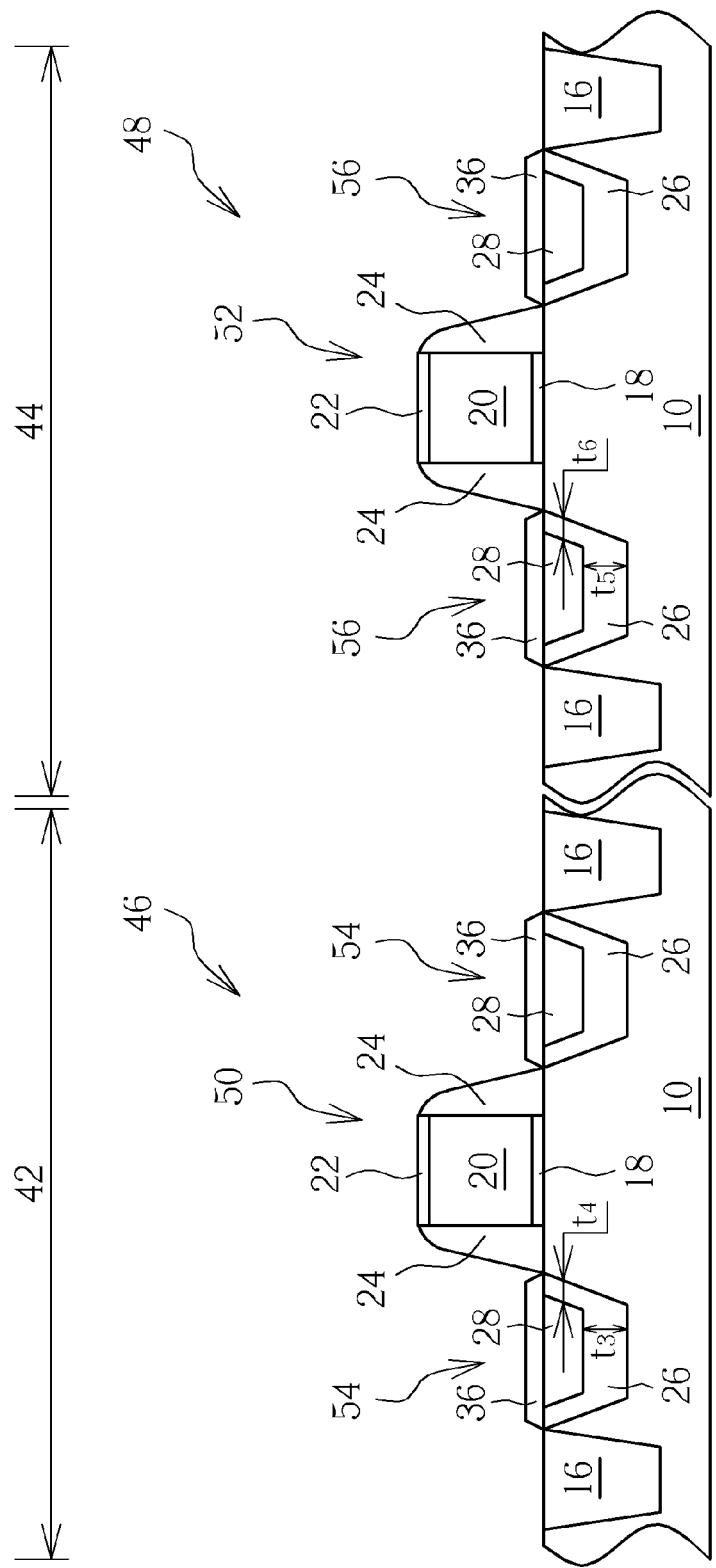
FIG. 10 illustrates a semiconductor device according to an exemplary embodiment of the present invention.

Please refer to FIG. 10. FIG. 10 illustrates a semiconductor device according to an exemplary embodiment of the present invention. As shown in FIG. 10, a semiconductor substrate 10 is provided, the semiconductor substrate 10 includes at least an iso region (namely an open region) 42 and at least a dense region 44, and a plurality of transistors 46/48 are respectively disposed in the iso region 42 and the dense region 44. Each transistor 46/48 includes at least a gate structure 50/52 and at least a source/drain region 54/56, and each of the source/drain regions 54/56 is disposed in the semiconductor substrate 10 at each of the two sides of the gate structure 50/52. In this exemplary embodiment, the widths of the source/drain region 54/56 are the same, but not limited thereto, the width of the source/drain region 54 could be substantially larger or smaller than the width of the source/drain region 56. Additionally, the present invention is also applicable for a plurality of source/drain regions having the different widths but being disposed in the same region having its individual pattern density, for instance, the present invention is applicable for a plurality of source/drain regions 54 having the different widths which are disposed in the same iso region 42. Each gate structure 50/52 includes a gate dielectric layer 18, a gate conductive layer 20 disposed on the gate dielectric layer 18, and a cap layer 22 disposed on the gate conductive layer 20. The gate dielectric layer 18 could be made of insulating materials such as silicon oxide, silicon oxynitride formed through thermal oxidation process or deposition process, or other high-k gate dielectric layer with a dielectric constant larger than 4. The gate conductive layer 20 may include conductive materials such as polysilicon, or metal layer with specific work function. The selectively formed cap layer 22 can be made of insulating materials such as silicon nitride, silicon oxide, or silicon oxynitride. Each of the source/drain regions 54/56 includes a first epitaxial layer 26, a second epitaxial layer 28 and a third epitaxial layer 36 as illustrated previously. The second epitaxial layer 28 may include the corresponding conductive dopants to serve as a doped source/drain region. The distribution density of the source/drain region 54 in the iso region 42 is substantially smaller than the distribution density of the source/drain region 56 in the dense region 44.

In this exemplary embodiment, the first selective epitaxial growth process has an operating pressure substantially smaller than or equal to 10 torr; accordingly, the first epitaxial layer 26 may have a bottom thickness t3/t5 and a side thickness t4/t6 in the iso region 42 and in the dense region 44, and the bottom thickness t3/t5 is substantially larger than or equal to the corresponding side thickness t4/t6 for each first epitaxial layer 26 in the respective region. In other words, a ratio of the bottom thickness t3/t5 to the side thickness t4/t6, that is, t3/t4 in the iso region 42 and t5/t6 in the dense region 44, are all substantially larger than or equal to 1. Furthermore, the ratio of the bottom thickness t3/t5 to the side thickness t4/t6 is preferably and substantially larger than or equal to 1.4. The second epitaxial layer 28 is disposed on the first epitaxial layer 26. The first epitaxial layer 26 includes a first material, while the second epitaxial layer 28 includes a second material, with a lattice constant of the first material and a lattice constant of the second material that are different from a lattice constant of the semiconductor substrate 10. The first material and the second material may include silicon-germanium (SiGe), and a first germanium concentration of the first material is substantially smaller than a second germanium concentration of the second material. The third epitaxial layer 36 is disposed on the second epitaxial layer 28, and the third epitaxial layer 36 may be made of silicon.

It is appreciated that the second epitaxial layer 28 includes conductive dopants such as p-type dopants or n-type dopants corresponding to the type of the transistors 46/48, while the first epitaxial layer 26 preferably excludes any conductive dopants. For instance, to build a PMOS, the second epitaxial layer 28 may contain boron ions, that is, parts of the second epitaxial layer 28 can serve as doped source/drain region. In order to avoid the abnormal leakage of the transistors 46/48, the first epitaxial layer 26 is disposed between the second epitaxial layer 28 and the semiconductor substrate 10 to prevent the diffusion of the conductive dopants from the second epitaxial layer 28 to the semiconductor substrate 10 through the dislocations between the epitaxial layers and the semiconductor substrate 10. The operating pressure of the first selective epitaxial growth process is substantially smaller than or equal to 10 torr; consequently, even if the iso region 42 and the dense region 44 have different distribution densities of the source/drain regions 54/56, in other words, the interval between the source/drain regions 54 in the iso region 42 is different form the interval between the source/drain regions 56 in the dense region 44, the first epitaxial layer 26 can still have the bottom thickness t3/t5 substantially larger than or equal to the side thickness t4/t6. Therefore, the problem of the bottom thickness of the first epitaxial layer 26 being substantially smaller than the side thickness of the first epitaxial layer 26 in the iso region 42 can be solved, and the first epitaxial layer 26 may have a better barrier function without micro-loading effect.

In conclusion, the present invention provides a selective epitaxial growth process having an operating pressure smaller than or equal to 10 torr to form the first epitaxial layer in the recess. This approach can be further performed in a plurality of regions having different pattern densities in the semiconductor substrate for simultaneously forming the first epitaxial layers in the recesses; each of the first epitaxial layers still has specific structure characteristics, that is, its bottom thickness is substantially larger than its side thickness. Accordingly, the process deviation due to the micro-loading effect may be eliminated, for instance, when the bottom thickness of the first epitaxial layer is substantially smaller than side thickness of the first epitaxial layer in the iso region, and reciprocally in the dense region, thereby improving the reliability of the semiconductor device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a semiconductor substrate comprising at least an iso region (namely an open region) and at least a dense region; and
a plurality of transistors respectively disposed in the iso region and the dense region, and each transistor comprises at least a source/drain region, wherein each of the source/drain regions comprises an undoped first epitaxial layer, each of the first epitaxial layers in the iso region and the dense region has a lattice constant, a bottom thickness and a side thickness, the lattice constant is different from a lattice constant of the semiconductor substrate and the bottom thickness is substantially larger than or equal to the corresponding side thickness for each first epitaxial layer.

2. The semiconductor device according to claim 1, wherein the ratio of the bottom thickness to the side thickness is substantially larger than or equal to 1.4.

3. The semiconductor device according to claim 1, wherein each of the source/drain regions further comprises a second epitaxial layer disposed on the first epitaxial layer.

4. The semiconductor device according to claim 3, wherein the first epitaxial layer comprises a first material, the second epitaxial layer comprises a second material, and a lattice constant of the first material and a lattice constant of the second material are different from a lattice constant of the semiconductor substrate.

5. The semiconductor device according to claim 4, wherein the first material and the second material comprise silicon-germanium (SiGe).

6. The semiconductor device according to claim 5, wherein a first germanium concentration of the first material is substantially smaller than a second germanium concentration of the second material.

7. The semiconductor device according to claim 3, further comprising a third epitaxial layer disposed on the second epitaxial layer.

8. The semiconductor device according to claim 7, wherein a material of the third epitaxial layer comprises silicon (Si).

9. The semiconductor device according to claim 1, wherein each of the transistors further comprises at least a gate structure, and the source/drain region is disposed in the semiconductor substrate at each of two sides of the gate structure.

* * * * *